(12) United States Patent
Erickson et al.

(10) Patent No.: US 8,953,365 B2
(45) Date of Patent: Feb. 10, 2015

(54) CAPACITOR BACKUP FOR SRAM

(71) Applicant: International Business Machines Corporation, Armonk, NY (US)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/912,324

(22) Filed: Jun. 7, 2013

(65) Prior Publication Data
US 2014/0362635 A1 Dec. 11, 2014

(51) Int. Cl.
*G11C 11/24* (2006.01)
*G11C 5/00* (2006.01)
*G11C 11/419* (2006.01)

(52) U.S. Cl.
CPC .............. *G11C 5/005* (2013.01); *G11C 11/419* (2013.01)
USPC ....... 365/149; 365/154; 365/185.08; 365/190; 365/229

(58) Field of Classification Search
CPC .. G11C 13/04; G11C 13/025; G11C 13/0011; G11C 2213/17; G11C 2213/79; G11C 5/141; H01L 2924/13091; H01L 2924/3025; H01L 27/11
USPC ..................... 365/154, 185.08, 190, 149, 229
See application file for complete search history.

(56) References Cited

U.S. PATENT DOCUMENTS

| | | | |
|---|---|---|---|
| 5,395,783 | A | 3/1995 | Baumann et al. |
| 5,541,427 | A | 7/1996 | Chappell et al. |
| 5,572,461 | A | 11/1996 | Gonzalez |
| 6,507,511 | B1 | 1/2003 | Barth, Jr. et al. |
| 6,646,943 | B2 | 11/2003 | Kim |
| 6,891,743 | B2 | 5/2005 | Ohbayashi et al. |
| 7,951,666 | B2 | 5/2011 | Ho et al. |
| 2006/0170044 | A1 | 8/2006 | Tu |
| 2007/0025141 | A1 | 2/2007 | Matsui |
| 2007/0168829 | A1 | 7/2007 | Shau |
| 2012/0182788 | A1* | 7/2012 | Kurokawa ..................... 365/149 |

OTHER PUBLICATIONS

Gill, B., et al, "A New Asymmetric SRAM Cell to Reduce Soft Errors and Leakage Power in FPGA" Department of Electrical Engineering and Computer Science, Case Western Reserve University, Cleveland, Ohio. 6 pages. © 2007 EDAA.
IBM, "SRAM Cell Stability Enhancement Via DRAM Technology", IP.com Prior Art Database Technical Disclosure. Original Publication Date Dec. 1, 1986. Original Disclosure Information TBD 12-86, p. 2826-2827. IP.com No. IPCOM000062505D, Mar. 9, 2005.

* cited by examiner

Primary Examiner — Thong Q Le
(74) Attorney, Agent, or Firm — Jonathan V. Sry; Robert R. Williams

(57) ABSTRACT

Embodiments of the disclosure provide a method for backing up data in an SRAM device, and an SRAM device that includes a capacitive backup circuit for backing up data in an SRAM device. The method may include writing data to the SRAM cell by applying an input voltage to set an input node of cross-coupled inverters to a memory state. The method may also include backing up the data written to the SRAM cell by electrically coupling the input node to the capacitive backup circuit. The method may also include restoring the data stored in the capacitive backup circuit to the SRAM cell by electrically coupling the capacitive backup circuit to the input node.

13 Claims, 8 Drawing Sheets

US 8,953,365 B2

CAPACITOR BACKUP FOR SRAM

TECHNICAL FIELD

The present disclosure relates to a static random-access memory (SRAM). In particular, this disclosure relates to backing up and restoring one or more SRAM cells.

BACKGROUND

SRAM memory cells are fast and dense storage devices. The size and density of the SRAM memory cells may make them susceptible to soft errors, which can be caused by radiation spikes from alpha particles, beta particles, gamma radiation, or ionized metal particles, which may change the state of the SRAM. These soft errors may cause errors that must be caught and corrected in order for the computer to continue functioning correctly.

SUMMARY

Embodiments of the disclosure provide a method for backing up data in an SRAM, and an SRAM device that includes a capacitive backup circuit.

One embodiment is directed towards a method of backing up an SRAM cell to a capacitive backup circuit of the SRAM cell. The method may include writing data to the SRAM cell by applying an input voltage to set an input node of cross-coupled inverters to a memory state. The method may also include backing up the data written to the SRAM cell by electrically coupling the input node to the capacitive backup circuit. The method may also include restoring the data stored in the capacitive backup circuit to the SRAM cell by electrically coupling the capacitive backup circuit to the input node.

Another embodiment is directed towards a Static Random Access Memory (SRAM) device. The SRAM device may include one or more SRAM cells. Each SRAM cell may have a first and a second CMOS inverter that are cross-coupled. The SRAM cell may also have a feedback switch coupled to an output of the first CMOS inverter and an input of the second CMOS inverter. The SRAM cell may also have a capacitive backup circuit coupled to the output of the feedback switch. The capacitive backup circuit may have a capacitor and a backup switch configured in a series connection between the capacitor and the feedback switch.

Another embodiment is directed towards an SRAM device. The SRAM device may include one or more SRAM cells. Each SRAM cell may have cross-coupled inverters that are configured and arranged to hold a memory state. Each SRAM cell may also have a capacitive backup circuit having at least one capacitive element. The capacitive backup circuit may be configured and arranged to store a backup copy of the memory state in response to the deactivation of a feedback switch and the activation of an input voltage. The capacitive backup circuit may also be configured to provide a backup copy of the memory state in response to the deactivation of the feedback switch and the deactivation of the input voltage.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

In the drawings and the Detailed Description, like numbers generally refer to like components, parts, steps, and processes.

DETAILED DESCRIPTION

Figure 1:
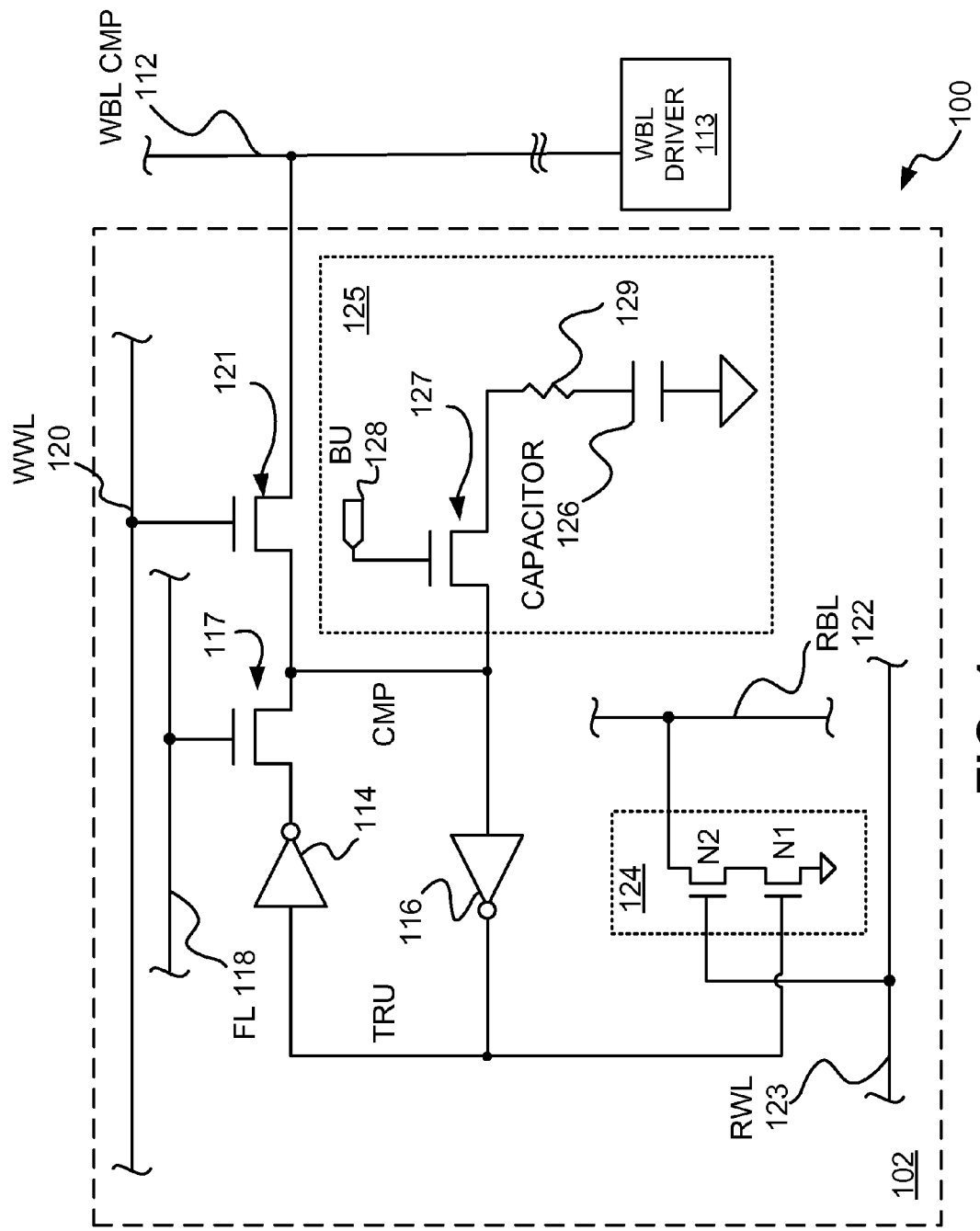
FIG. 1 illustrates an SRAM device that incorporates an eDRAM trench capacitor, according to various embodiments.

Aspects of the present disclosure are directed toward a method of backing up an SRAM cell memory state to a capacitive backup circuit of the SRAM cell by writing data to the SRAM cell, backing up the data written to the SRAM cell in the capacitive backup circuit, and restoring the data stored in the capacitive backup circuit. Although not necessarily limited thereto, embodiments of the present disclosure can be appreciated in the context of integrated circuits and problems relating to density and scaling.

Since the development of integrated circuits, the potential for reduced signal propagation time and increased functionality of individual chips as well as manufacturing economy have driven the development of increases in integration density and scaling of individual circuit elements therein to smaller sizes. This incentive for scaling is particularly strong for memory devices which have approximately quadrupled in capacity every three years. However, such scaling of individual elements inevitably increases criticality of many aspects of operation such as operation at reduced voltages, susceptibility to noise, heat dissipation and the like.

Among other problems aggravated by scaling, particularly in memory structures, is the problem of soft errors due to the transit of radiation through a memory cell. Radiation is substantially unavoidable in the environment and its relatively high energy causes ionization which can introduce charge into the circuit in an unpredictable manner but without causing damage to the circuit element or impairing its function. This is particularly true in deep space applications such as satellite circuitry. In practical effect in a memory cell, the disturbance of charge may be sufficiently great that the storage or logic state of the cell will be changed and the data corrupted but the cell will be capable of functioning correctly when new data is stored. For this reason, such errors are referred to as "soft" as opposed to "hard" errors such as a failed transistor or a wiring defect which prevents correct functioning of the circuit.

Scaling causes increased susceptibility to soft errors because it decreases the amount of charge required to induce a soft error through a number of mechanisms. That is, the amount of charge developed by the traverse of a given radiation particle through a circuit is highly variable depending on a number of factors such as the energy of the radiation, its trajectory through the circuit and the like. Therefore, not all incident radiation will induce a soft error. However, reduction of the amount of charge necessary to induce a soft error can be considered as a reduction in the stability of a memory cell and, for a given distribution of energies and trajectories of a given flux of radiation, the number of soft errors will increase as the critical amount of charge that will induce a soft error, $Q_{crit}$, decreases. The amount of charge that can upset a memory cell of a given type has been decreasing by about one-half per generation; more or less proportionally to the decrease in circuit element and memory cell dimensions.

Further, numbers of soft errors per chip are increased by increased integration density. Substantially increased total soft error rates of about 50K ppm/khr/chip (with some significant differences between low to high and high to low transition errors) are projected for 8 Megabyte memories currently being designed and manufactured having a cell size of about 2.5 to 5 $\mu m^2$. That is, while soft errors are relatively rare and current memory cell designs are highly reliable and stable, such a memory can now be expected to experience a soft error, on average, every one to two months and may vary significantly (e.g. may double or more) with the logic state stored. (By way of comparison, soft error rates were negligible in SRAM designs of only a few generations previous to current designs.) Given the amount of memory generally associated with modern processors and the fact that any soft error corrupts data or an application program, it can be readily appreciated that some provision must be made for correction or avoidance of soft errors in order to support acceptable processor performance.

It should also be appreciated that many different types of data storage structures are known in the art; each with its own potentialities and problems. For example, so-called SRAMs offer the fastest access time because they need not be refreshed or use sense amplifiers capable of sensing a minute difference in charge which may slow response time in dynamic memories. Thus static memories are often used for caching at a location hierarchically adjacent to a processor, often on the same chip with the processor or other logic devices such as in registers.

However, static memory cells present problems which have been largely intractable in regard to soft errors, particularly as attempts are made to increase chip capacity. Specifically, static memory cells require more active devices (e.g. transistors) per memory cell and therefore scaling must be more aggressive to increase memory capacity and integration density. At the same time, scaling decreases the current carrying capacity of individual transistors and can reduce stability of the cell and well as the ability of the cell to drive the capacitance of connected bit lines.

Additionally, since static memories are hierarchically proximate to the high speed circuitry which utilizes the data stored, the opportunity for providing error detection and correction is reduced and error checking and correction often compromises response and memory access speed, particularly if correction must be performed. Therefore, the problem of soft errors is particularly critical in SRAM structures and it is anticipated that the invention will have most beneficial applicability in that environment. Accordingly, while the invention will be disclosed in connection with an SRAM environment which is currently preferred by the inventors, it should be understood that the invention is applicable to other integrated circuit environments, as well.

Traditionally, error correction code on a system on a chip may be limited in the number of errors that it can detect and fix. During a soft error, another response for the system is to reboot which costs down time. In environments with periodically high radiation spikes, e.g., deep space, it may be especially advantageous to restore an SRAM to a known state prior to a data corruption event, e.g., a radiation spike. Furthermore, in any SRAM environment, error correction typically is capable of correcting a single bit error and detecting a double bit error. A word in a capacitor-backed SRAM may be capable of being corrected by using the value stored in the capacitor, even if the error checking logic, such as ECC (error checking and correcting) circuitry, detects a multibit error.

An aspect of this disclosure is to include an eDRAM trench capacitor in each SRAM cell of an SRAM device, along with the gates to control access to the capacitor. For example, one or more n-type Field Effect Transistors (NFETs) may be used to control access to the eDRAM trench capacitor or isolate the capacitor. The SRAM device may perform a write or backup operation to record a state of the SRAM cell in a capacitive backup circuit. The saved state can then be read when restoring the data once cell corruption is determined. The capacitive backup circuit can use a capacitive element to store the state and may be referred to as a capacitive backup circuit through this disclosure. To compensate for leakage current, the stored state can be refreshed by performing repeated backup operations.

The backup operation of the SRAM cell may use any number of timing signals. The timing signals may be controlled by a memory controller in some embodiments. The memory controller may work in conjunction with a circuit designed to detect sources of soft errors, such as a radiation detector. The radiation detector may determine high instances of radiation. In certain embodiments, a soft error detector can be designed using dedicated SRAM cells linked to a number of fuses programmed into the SRAM cells. Data is written to the SRAM cells according to a predetermined signature. The fuses are each also programmed with the known signature. The stored data from the SRAM cells may be read and compared with the known signature on the fuses to determine if the data stored in the SRAM has been corrupted.

In some embodiments, the memory controller may adjust the frequency of the backup operation of the state of the SRAM cell to a capacitor on the SRAM cell based on the radiation detected. For example, if the radiation detector detects a period of high radiation, then the memory controller may direct the backup operation of the state of the SRAM cell to occur less frequently, e.g., every 1000 cycles instead of every 100 cycles, to reduce the likelihood of saving data that is corrupted by radiation. In other embodiments, the radiation detector may incorporate error correcting code into the SRAM cell 102 in the presence of a radiation spike to ensure that data written to the backup capacitor is correct.

The present disclosure may allow an SRAM device to operate in multiple operational modes. For example, the SRAM device may have a normal operation, where the SRAM device saves data in a short-term configuration. The SRAM device may have a backup operation, where the SRAM device records a memory state of the device to a capacitive backup circuit. The SRAM device may also have a restore operation, where the SRAM device reads the data from the capacitive backup circuit.

FIG. 1 illustrates an SRAM device 100 that incorporates the eDRAM trench capacitor, according to various embodiments. The SRAM device 100 may have one or more SRAM cells with each SRAM cell connected to one or more write bit lines (WBL), e.g., WBL CMP 112. In the shown embodiment, the SRAM device 100 is configured in a single-ended write configuration with a single WBL, but a double-ended write configuration with two WBLs is possible.

The WBLs may be in a global configuration. The WBL CMP 112 may couple to a WBL driver 113. The WBL driver 113 may drive a logical one or zero from a register (not pictured) to the SRAM cell 102 through the WBL CMP 112. In the configuration shown, the WBL driver 113 may perform writing operations. For example, the write and read operations are performed in separate operations and the WBL driver 113 may perform the write operation while a read circuit performs the read operation.

However, SRAM device 100 may be configured to perform read and write operations through the WBL CMP 112. Additional components may be required. For example, in the read operation, additional capacitors may be needed between the pass transistor 121 and the WBL 112 in order to stabilize the read operation. When the read and write operations are both performed through the WBL 112, then the WBL driver 113 may further connect to a sense amplifier (not pictured). In the described example where the SRAM device 100 performs both read and write operations, the WBL driver 113 may be tri-stated in a read operation and activated in the write operation.

For purposes of illustration, the operation of one SRAM cell, SRAM cell 102 will be described in detail. SRAM cell 102 may have two cross-coupled CMOS inverters, inverter 114 and inverter 116. In some embodiments, the inverter 114 may be referred to as a first inverter while the inverter 116 may be referred to as a second inverter. The first inverter 114 may output to a complement (CMP) node of the SRAM cell 102, while the second inverter 116 may output to a true (TRU) node of the SRAM cell 102.

The SRAM cell 102 may receive an input voltage from the WBL CMP 112 at the CMP node. The CMP node may also be referred to as an input node throughout this disclosure. In an embodiment, the second inverter 116 may receive the input voltage and invert the voltage to form an input to the first inverter 114. The SRAM cell 102 may hold a memory state as long as the power to the SRAM cell 102 is active. For example, if the input voltage is a logical one at the input node, then the second inverter 116 may invert the input voltage to a logical zero. The memory state may also be referred to as a charge state throughout this disclosure. The first inverter 114 may receive the logical zero input from the second inverter 116 and output a logical one to the second inverter 116. The memory state may refer to the value "saved" on the SRAM cell 102, which, in the mentioned example, is a logical zero at the TRU node.

The inverter 114 may invert the signal from the true (TRU) side and output to the complement (CMP) side through an n-channel field effect transistor (NFET) 117 referred to as a feedback transistor or feedback switch 117. Through this disclosure, it may be understood that a transistor is a type of switch and the two terms may be used interchangeably. In one embodiment, the feedback transistor 117 can isolate the CMP node from the inverter 114. When the feedback transistor 117 receives a controlling feedback signal from the feedback line (FL) 118 indicating a logical high or turned "on," the feedback transistor 117 is enabled and the inverter 114 can drive an output to the CMP. When the feedback line 118 is a logical low or turned "off," the CMP node is isolated from inverter 114. The inverter 116 is configured to drive the inverse of the signal from the CMP side to the TRU side.

The CMP node of the SRAM cell 102, in an embodiment, may be connected to the WBL CMP 112, through pass transistor 121. The pass transistor 121, may allow the coupling between the WBL 112 to CMP of the SRAM cell 102. The pass transistor 121, may also be referred to as a pass switch. The pass transistor 121 may be selected by a write word line (WWL) 120. The WWL 120 may be a word line that connects one or more SRAM cells in a row. The WWL 120 may be activated to write a row of SRAM cells. The SRAM cell 102 may have another pass transistor 121 that is selected by WWL CMP 120. Pass transistor 121 may connect to the WBL CMP 112. The pass transistor 121 may receive a write signal from WBL CMP 112. A logical one signal on the WWL 120 allows access to the SRAM cell 102 through WBL CMP 112.

Consistent with various embodiments, the SRAM cell 102 can (optionally) include a read circuit 124. The read circuit 124 may be further connected to domino logic or other logic that causes the least disturbance to a read operation of the SRAM cell 102.

The read circuit 124 may have two NFETs, N1, and N2. N1 may connect to a ground at the source and to N2 at the drain. N1 may be controlled by a signal from the TRU node of the cross-coupled inverters. The read circuit 124 may connect N1 to a read bit line (RBL) 122. N1 may be controlled by a signal from the read word line (RWL) 123. RWL 123 may be a word line that controls the read of a row of SRAM cells. An on signal from the RWL 123 may activate the read of the SRAM cell 102. RBL 122 may be a global bit line that reads one or more SRAM cells. The RBL 122 may be pre-charged and may output to an inverter (not shown).

The read circuit 124 may be necessary in embodiments of the disclosure to allow for an asymmetric configuration of the SRAM cell 102. In the asymmetric configuration, the inverter 114 may be stronger and less sensitive than the inverter 116 (discussed further below). By connecting the read circuit 124 to the output of the inverter 116, the current strength from inverter 116 may be impacted to a lesser degree than other configurations. In addition, the read circuit 124 may allow for increased speeds relative to performing the read and write operations on the word bit line 112.

The read circuit 124 may read the state of the SRAM cell 102 and may be further transmitted to a register (not pictured). In the shown embodiment, the read circuit 124 is connected to the TRU node, but other configurations are contemplated. The read circuit 124 may perform a reading function. The reading function may read the state of the SRAM cell 102. The read circuit 124 may perform a single-ended read which may minimize the current leakage from the SRAM cell 102 in some embodiments. The presence of the read circuit 124 may allow design flexibility for either a symmetrical or asymmetrical SRAM cell 102.

The SRAM cell 102 may include a capacitive backup circuit 125. The capacitive backup circuit 125 may include a capacitor 126 and a backup transistor 127. The backup transistor 127 may also be referred to interchangeably with a backup switch throughout this disclosure. The capacitor 126 may store a signal from the SRAM cell 102 while the SRAM cell 102 is operating. In some embodiments, the capacitor 126 may be connected in series to a resistor 129. The resistor 129 may be $2e^3$ ohms, or a 2K resistor. The resistor 129 may consist of any polysilicon material, according to various embodiments. In certain embodiments, the capacitor 126 may be a 22 nm deep trench metal-insulator-metal (MIM) capacitor and may include a resistance barrier. In a possible configuration, the capacitor 126 may hold a charge of $1e^{-12}$ C- $1e^{-15}$ C. Consistent with various embodiments, the capacitor 126 can be designed with sufficient voltage rating (e.g., size) to accommodate the voltage from the WBL 112 without damaging the capacitor 126.

Aspects of the present disclosure are based upon the recognition that a storage capacitance can be more resistant to radiation (relative to an SRAM cell) because a high energy particle is not as likely to change the state stored on a capacitor (e.g., because the capacitor is not as susceptible to the creation of an ionization track to the substrate).

The backup transistor 127 may be an NFET, and may control access to the capacitor 126 and allow the capacitor 126 to be isolated from the data stored in SRAM cell 102. The gating on the backup transistor 127 may receive a backup signal 128 that may allow a discharged capacitor 126 to charge to the state of the SRAM cell 102. For example, when the backup signal 128 is a logical one, and the state of the SRAM cell 102 at the CMP is a logical one, the discharged capacitor 126 may charge to a logical one. When the backup signal 128 is a logical zero, or "off" after the capacitor 126 is charged with the logical one state, the backup transistor 127 may allow the capacitor 126 to retain a charge. The backup signal 128 may be a global backup signal and effect one or more SRAM cells 102 simultaneously in an embodiment. When the state of SRAM cell 102 is to be backed up from capacitive backup circuit 125, feedback line 118 should be at logical zero so that charge from capacitive 126 is not drained by inverter 114.

The embodiment shown on FIG. 1 is a symmetric configuration where WBLs are connected to the TRU and CMP nodes. In the symmetric configuration, the feedback line 118 may be coordinated with the WWL 120. For example, during normal reads and writes to SRAM cell 102, feedback line 118 would be a logical one and the reads and writes would occur as is done in a conventional SRAM cell.

In some embodiments, the SRAM cell 102 may have only one WBL, e.g., WBL CMP 112, in single-ended write configuration. In the shown configuration, the SRAM cell 102 is in an asymmetric configuration. When in the asymmetric configuration, the inverter 116 is the weaker inverter while the inverter 114 is the stronger inverter. The stronger inverter 114 may be made, for example, by increasing the width of the wires of the PFET and NFET. The inverter 114 may also be made stronger by increasing the size of the PFET and the NFET, according to various embodiments. The signal output from inverter 114 needs to have a stronger drive strength than the inverter 116 because the output from the inverter 114 has to overcome the resistance from the feedback transistor 117 and the backup transistor 127.

In an embodiment, the inverter 114 may be weaker or stronger than the WBL driver 113 so that the WBL driver 113 can write the capacitive backup circuit 125. In one embodiment, the inverter 114 may be stronger than the WBL driver 113 and work in conjunction with the feedback transistor 117. The feedback transistor 117 may control the stronger current from the inverter 114 to allow the WBL driver 113 to write the SRAM cell 102. In certain embodiments, the inverter 114 may be weaker than the WBL driver 113, e.g., when the SRAM device 100 performs both the read and write operations through the WBL 112.

The beta ratio for inverter 116 may be biased to make inverter 116 more reactive to small voltage changes at the CMP node. Furthermore, the signal at the CMP node can be set strong enough to overpower the capacitor 126 during charging.

Figure 2:
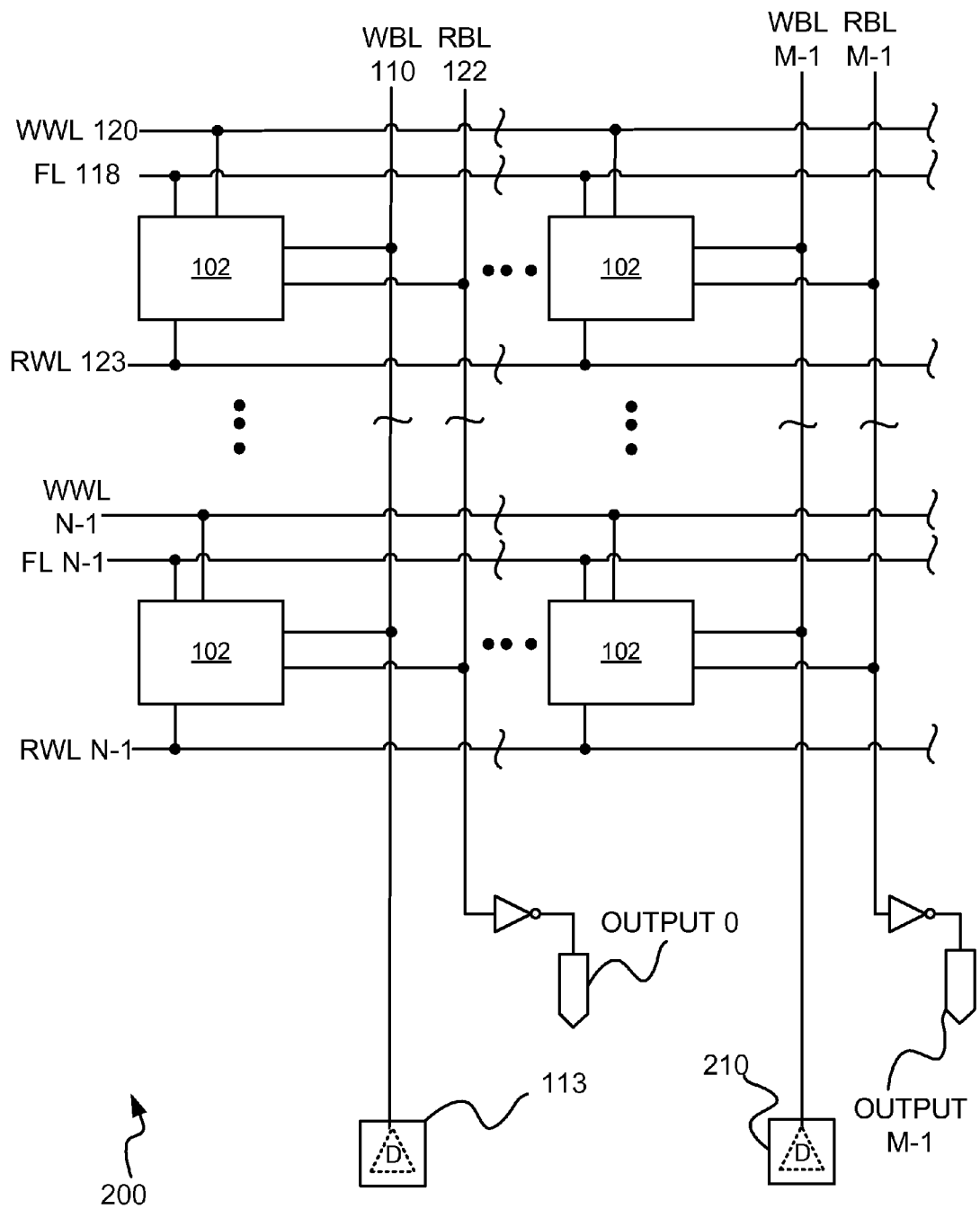
FIG. 2 illustrates an SRAM array configuration, according to various embodiments.

FIG. 2 illustrates a high-level schematic of an SRAM device 200, according to various embodiments. In the shown configuration, the SRAM device 200 has the same components of the SRAM device 100 of FIG. 1. The SRAM device 200 shows four SRAM cells 102 in two rows, a first and a second row; and two columns, a first and a second column. The first column is driven by the WBL driver 113 through the WBL 110. The first column also has a RBL 122 that reads the state of the SRAM cell 102 and outputs to output 0. As mentioned above, the RBL 122 may be pre-charged. The second column may be driven by the WBL driver 210 through the WBL M−1. The second column has a RBL M−1 that reads the state of the SRAM cell 102 and outputs to output M−1. It is understood that any number of columns between the first column and the second column may exist.

The first row may have a WWL 120, and a FL 118. As described above, the FL 118 may be separate from the WWL 120. The signal to initialize the read operation may be controlled by RWL 123. The second row may have WWL N−1, FL N−1, and RWL N−1. It is understood that any number of rows between the first row and the second row may exist.

Figure 3:
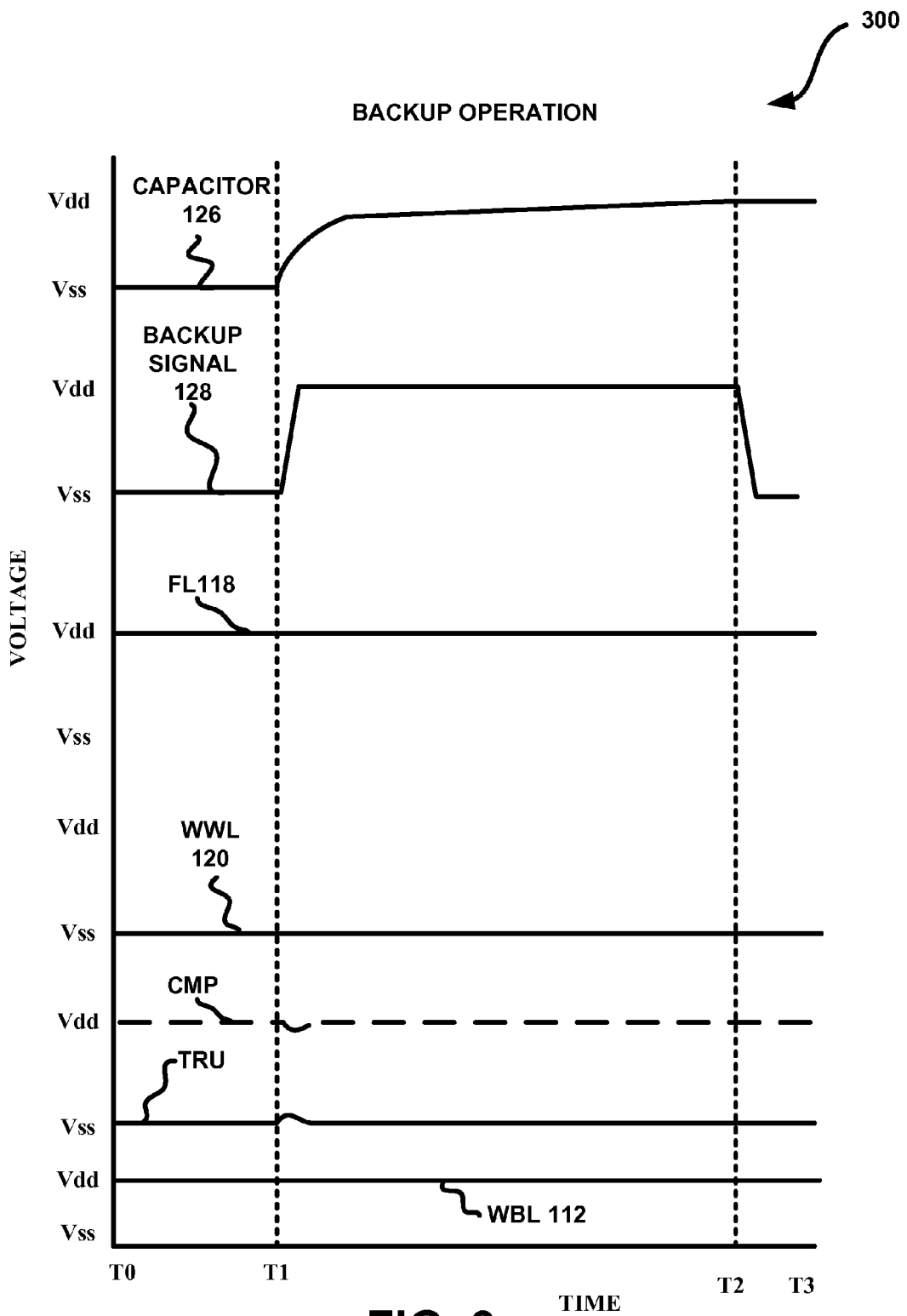
FIG. 3 illustrates a timing diagram of a backup operation of the SRAM cell, according to various embodiments.

FIG. 3 illustrates a timing diagram 300 of the backup operation of the SRAM device, according to various embodiments. Throughout this disclosure, the backup operation may be referred to as a backup or backing-up of the SRAM cell 102. The capacitor 126 may store a memory state from the SRAM cell 102 in the backup operation. In the backup operation, the capacitor 126 may automatically back up the memory state from the SRAM cell 102 for a set number of cycles. For example, the SRAM cell 102 may automatically backup every 100 cycles, or any number of cycles as set by a user. However, there may be a trade off with the number of backups between cycles and the overall performance of a computing system. For example, a backup every two cycles would allow more recent data but may require more overhead in order to charge the capacitor 126. Both the saving and using data from the capacitor 126 may be performed for one or more SRAM cells such as in an array configuration.

The timing diagrams for the backup signal 128, the WWL 120, the feedback line 118, the TRU, the CMP, the WBL 112, and the capacitor 126 are shown at times T0 through T3. A signal is driven through the WBL 112 from the WBL driver 113. The WBL 112 produces a logical one signal through T3. The WBL 112 signal is transmitted through NFET 121 when WWL 120 is high. The timing diagram 300 begins at time T0. The SRAM cell 102 has a logical one signal at the CMP which is inverted by the inverter 116 to produce a logical zero signal at TRU.

In certain embodiments, the operation from T0 through T1 may be an initialization operation for the SRAM device 100, e.g., during a start up phase. For purposes of illustration, it is assumed that the initial memory state of the SRAM cell is a logical zero (at the TRU) at the initialization. At a point between T0 and T1, a logical one at the feedback line 118 is applied to the gate of the feedback transistor 117. The logical one signal may activate the feedback transistor 117 and connect the output from inverter 114 to the CMP. Once the feedback line 118 is turned on, then the SRAM cell 102 may form a feedback circuit.

The timing signals between T1 and T2 may represent the charging of the backup circuit. At T1, the backup transistor 127 may receive a logical one backup signal 128 at its gate. The logical one signal causes the backup transistor 127 to connect the CMP to the capacitor 126. When the backup transistor 127 receives a backup signal 128 with a logical high, then the capacitor 126 absorbs the state in the SRAM cell 102. The capacitor 126 slowly absorbs the charge of the SRAM cell 102. The absorption, or charge sharing, causes a momentary drop in the CMP voltage (and gain in the TRU voltage). The charge sharing may be nearly instantaneous and may function as the capacitor 126 charges. The charge sharing may be less significant due to the high resistance of the capacitor 126 in some embodiments. The charge sharing may be minimal due to the WWL 120 being turned off. The loss of current at CMP is replenished with the current from the inverter 114. In an embodiment, the inverter 114 may be stronger than the WBL driver 113, therefore the pass transistor 121 may prevent the inverter 114 from overpowering the WBL driver 113. In some embodiments, the capacitor 126 may need to be discharged or refreshed prior to writing to erase any of the prior state.

At a point between T1 and T2, the CMP voltage is constant because the draw from the capacitor 126 is minimal since the capacitor 126 has almost reached its steady-state charge level. The CMP and TRU retain their state because the SRAM cell 102 is in a charged state with a logical one signal at CMP which is inverted by inverter 116. In some embodiments, the capacitor 126 may perform a buffering action which allows the CMP to maintain its state without an external write from the WBL 112. For example, if the backup transistor 127 is turned on while the capacitor 126 is charging, then the lack of a write signal from the WBL 112 may cause the capacitor 126 to discharge to the prior write. At T2, the backup 127 is deactivated with a logical zero backup signal 128 which causes the capacitor 126 to retain the charge. At T1, the capacitor 126 may be overwritten without a refresh, according to various embodiments. The time may vary depending on the type of signal overwriting the prior state of the capacitor 126. For example, if a logical zero or low state is overwriting an existing logical one state on the capacitor 126, then the operation may take longer than overwriting a logical zero with a logical one.

Figure 4:
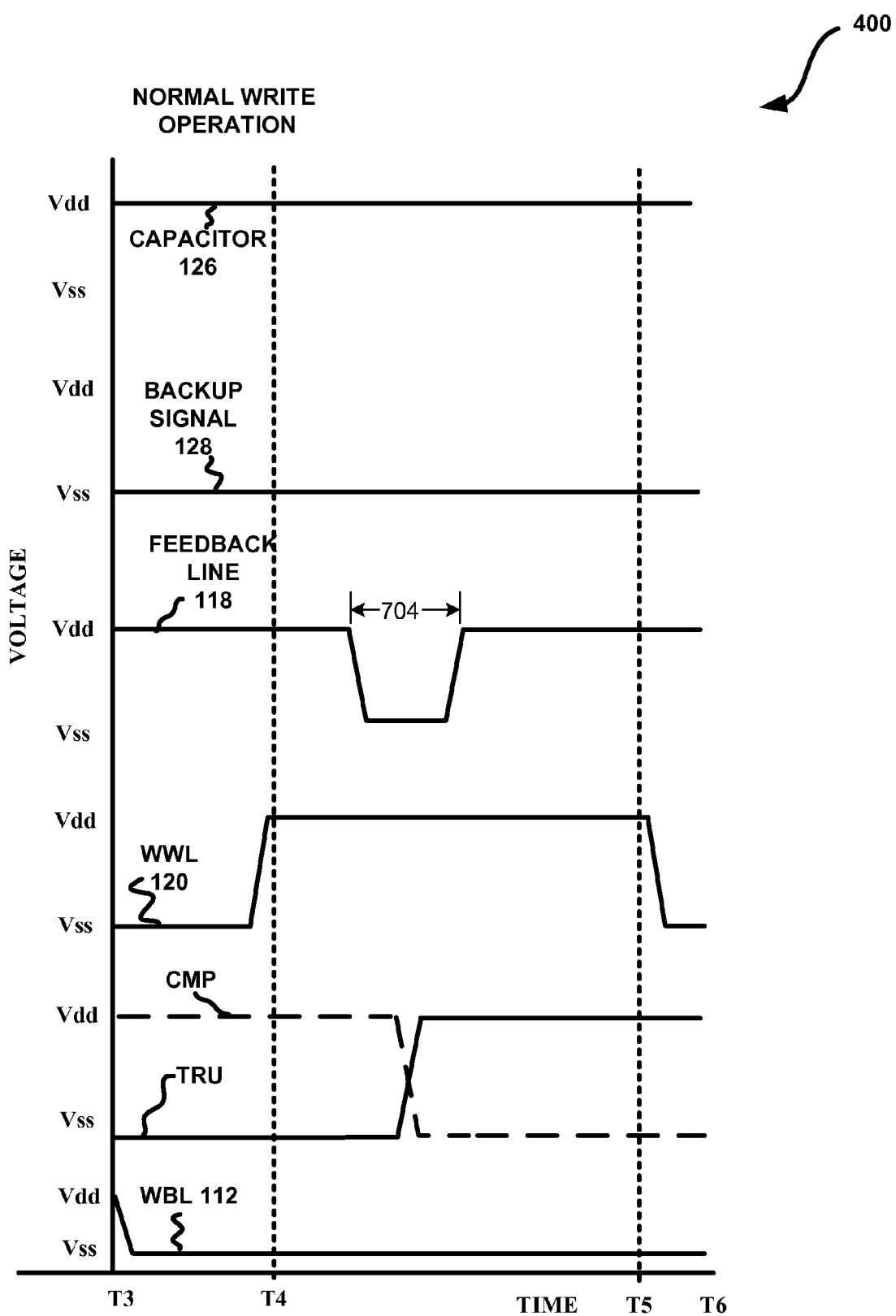
FIG. 4 illustrates a timing diagram of the normal write operation for the SRAM device, according to various embodiments.

FIG. 4 illustrates a timing diagram 400 of the normal write operation for the SRAM device, according to various embodiments. In the normal write operation for the SRAM cell 102, the backup signal 128 is turned off and the capacitor 126 retains the memory state from the backup operation. In the shown example, the WBL driver 113 may write a logical one memory state to SRAM cell 102 a logical zero memory state as measured at the TRU. The timing diagram 400 may begin at T3 and end at T6. At T3, the WBL 112 may shift from transmitting a logical one to a logical zero signal. Between T3 and T4, the WWL 120 may be activated. Once the WWL 120 is turned on, then the WBL 112 may transmit a logical zero signal to the SRAM cell 102.

At T4, the feedback line 118 may be cycled from a logical one to a logical zero. The switching off of the feedback may be necessary in a configuration where the inverter 114 is stronger than the WBL driver 113. When the inverter 114 is stronger, then the current from inverter 114 may corrupt the signal along the WBL 112. If the feedback 118 is turned off after the WWL 120 is turned on, then the WBL 112 may write the SRAM cell 102 before the inverter 114 starts to overpower the WBL driver 113. After the feedback 118 is turned off, then the CMP and TRU may begin to switch. The feedback 118 may be turned on at some point after CMP and TRU switch in order to maintain the memory state of the SRAM cell 102. The time that the feedback 118 is switched off and then back on may be referred to as a pulse with a pulse width 704. The pulse is described below in FIG. 7A.

At T5, the WWL 120 may be turned off which may cut off the signal from WBL 112. At T5, the feedback signal 118 may also be at a logical one. The voltage at the capacitor 126 may drop slightly because of the leakage effect of current. The TRU and CMP nodes hold their memory state. Even though only the normal write operation is shown, the normal read operation may work in a manner consistent with that normally found in the art.

The time between T3 and T6 is shown as one cycle but may be 100 cycles. The number of cycles may be determined by the dissipation time on the capacitor 126. The dissipation time on the capacitor 126 is governed by charge loss. The dissipation time should be greater than the refresh time. For example, if the capacitor 126 dissipates to ground every 300 cycles, then the capacitor 126 may backup the SRAM cell 102 every 100 cycles.

In the shown embodiment, the refresh time is fixed, e.g., refreshing the capacitor 126 every 100 cycles or every 1000 cycles. In some embodiments, it may be possible for the refresh time to be variable. For example, the capacitor 126 may be refreshed 100 cycles, then 150 cycles, then 110 cycles. In a variable refresh time, the memory controller may have a clock that tracks the number of cycles that have elapsed, e.g., such as in eDRAM, so that the memory controller may keep track of the point of time when the data was read.

Figure 7A:
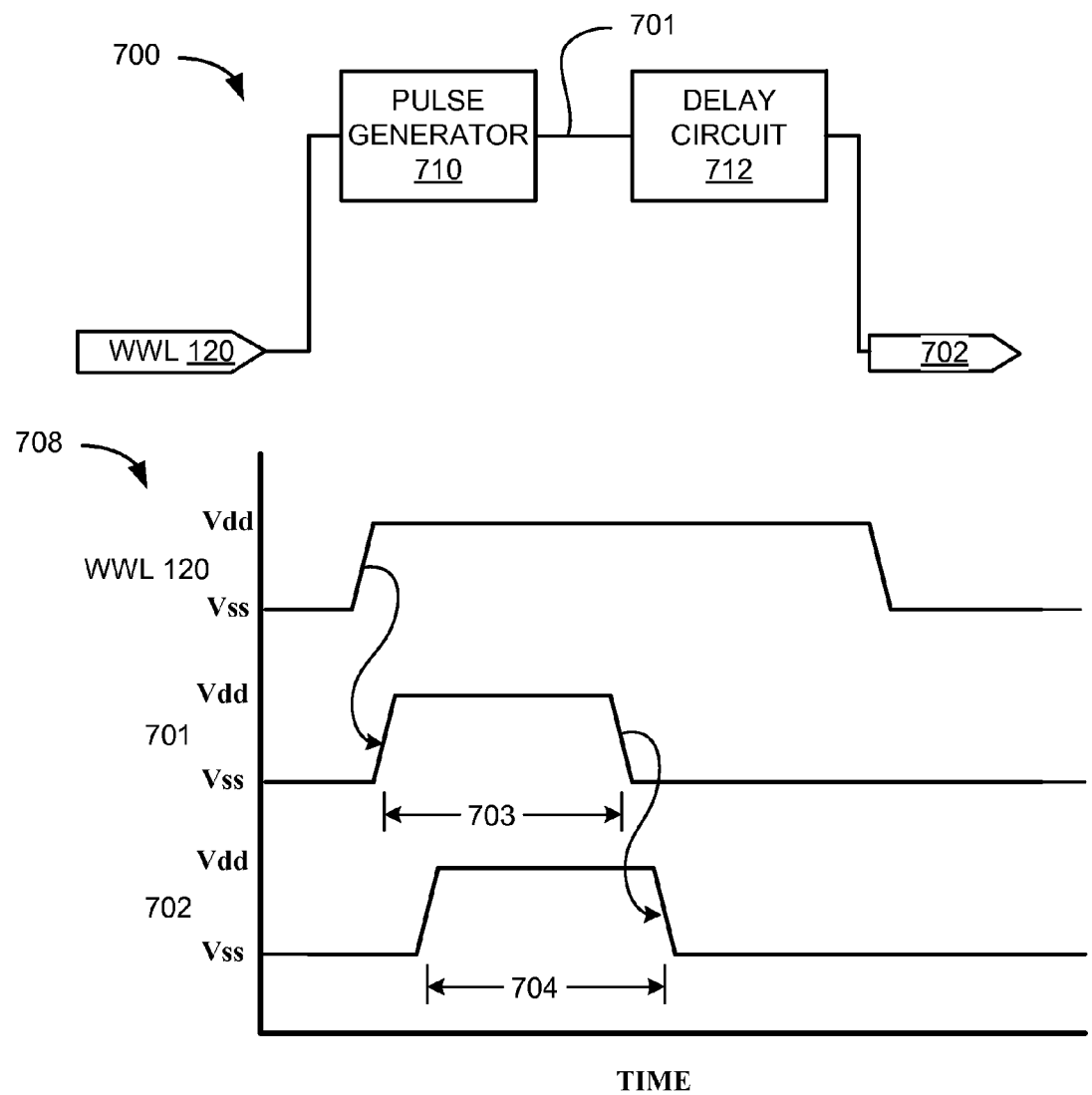
FIG. 7A illustrates a circuit that produces a pulse during the normal write operation and a corresponding waveform diagram produced by the circuit, according to various embodiments.

FIG. 7A illustrates a circuit 700 that produces a pulse for the normal write operation and corresponding waveform diagram 708 produced by the circuit, according to various embodiments. The circuit 700 may couple to the WWL 120 and output to 702. The circuit 700 may have a pulse generator 710 and a delay circuit 712 arranged in a serial fashion. The pulse generator 710 and delay circuit 712 may be wired to produce a delayed pulse, e.g., the pulse in the feedback line 118 in FIG. 4. The pulse signal 701 may result from the pulse generator 710 and a delayed pulse signal 702 may result from the delay circuit 712.

Waveform diagram 708 illustrates the signals that originate from the circuit 700. WWL 120 may produce a signal from which the pulse generator 710 generates a pulse signal 701. The pulse signal 701 may be of a particular pulse width 703. The delay circuit 712 may take the pulse signal 701 and produce a delayed pulse signal 702 of a particular pulse width 704. The pulse signal 702 may be delayed using any amount of time. According to various embodiments, the pulse width 703 may not match pulse width 704. The delayed pulse signal 702 may continue to a logic element such as a NOR gate shown in FIG. 7C (discussed below). The pulse width 704 may further match the pulse width between T4 and T5 on the feedback line 118 in FIG. 4.

Figure 5:
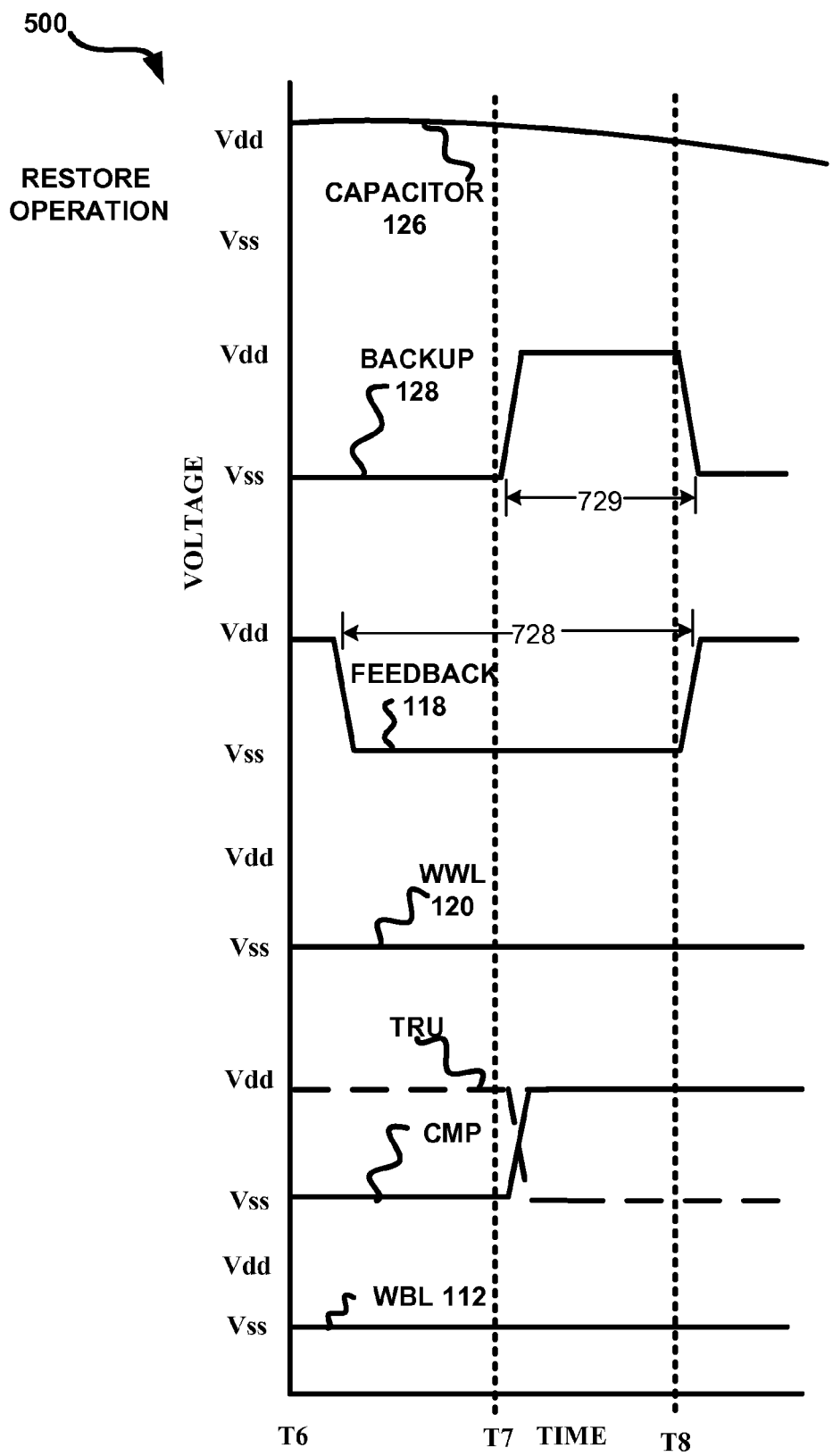
FIG. 5 illustrates a timing diagram 500 of the restore operation of the SRAM device, according to various embodiments.

FIG. 5 illustrates a timing diagram 500 of the restore operation of the SRAM device, according to various embodiments. The restore operation may read a stored memory state from the backup circuit 125 and use the stored memory state to write the SRAM device 100. The timing diagram may begin at T6 and end at T8.

Between T6 and T7, The capacitor 126 would lose some charge in the process as noted by the drop in voltage, e.g., due to leakage current or other non-idealities. The feedback line 118 may be turned off, in order to reduce the effect of the inverter 114. The feedback line 118 may be turned off and on with a pulse. The pulse may have a pulse width 728 (described further below). In an embodiment, the inverter 114 is driving a strong current that would overpower the current from the capacitor 126.

Between T7 and T8, the backup transistor 127 is activated which allows the high backup signal 128 held by the capacitor 126 to drive the cell since the CMP node has a low signal. The backup transistor 127 may be activated with a pulse of pulse width 729 (described below). The CMP node would be switched from a low to a high signal which would bring the TRU node to a low signal. Once the capacitor 126 is read once, then the capacitor 126 may not be read again and may need to be written again in another cycle. In another embodiment, once the capacitor 126 is read then there may be an active discharge state to pull the capacitor 126 toward ground so that it can be written again.

At T8, the backup transistor 127 may be deactivated with a logical low backup signal 128 at the control gate. The capacitor 126 may continue to lose charge (e.g., due to current leakage). The feedback transistor 117 may be activated at T8, which would restore the SRAM cell 102 to the memory state before the backup.

Figure 7B:
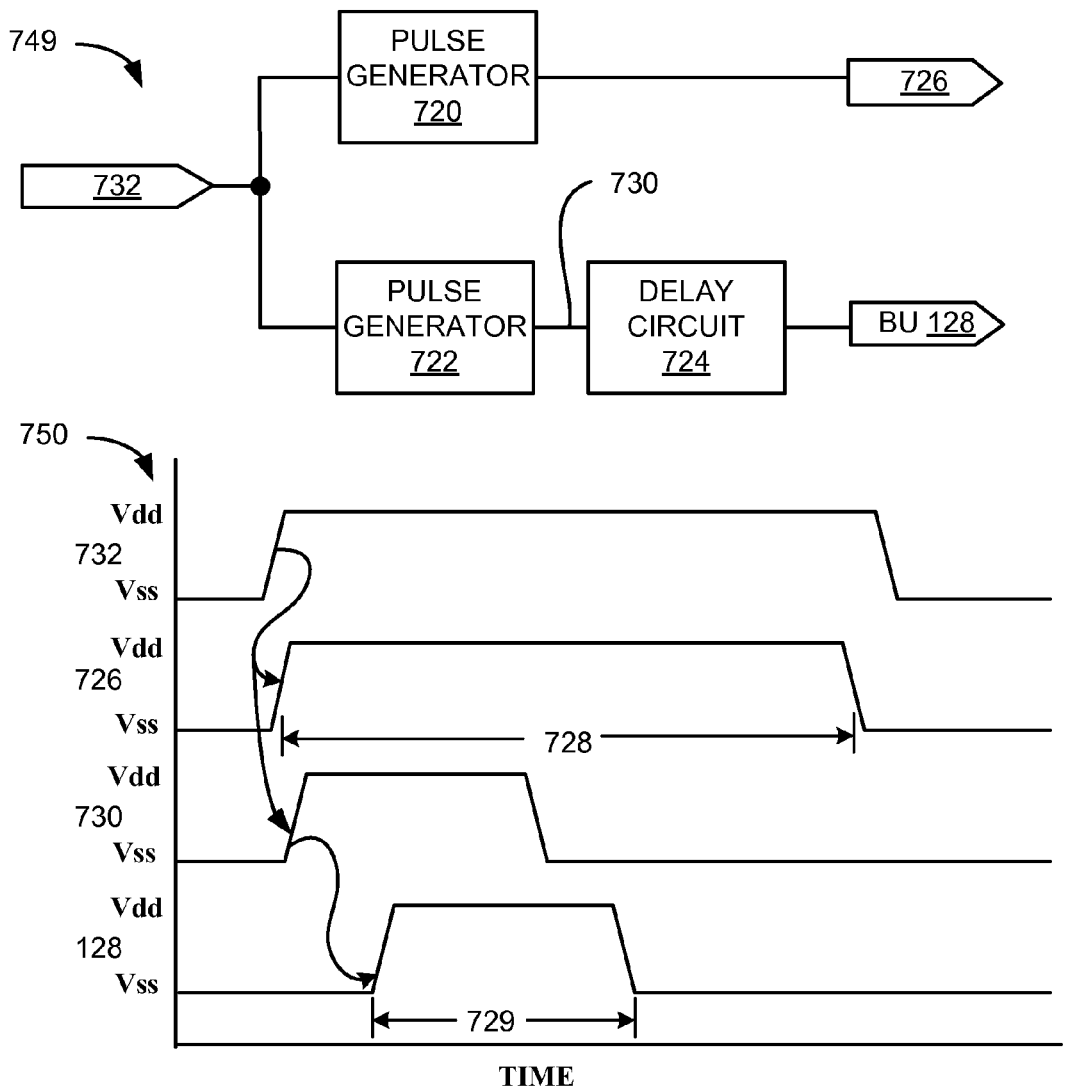
FIG. 7B illustrates a circuit that produces a pulse during the restore operation and the corresponding waveform diagram, according to various embodiments.

FIG. 7B illustrates a circuit 749 that produces the pulse for the restore operation for the feedback line 118 and the backup transistor described in FIG. 5 and the corresponding waveform diagram 750, according to various embodiments. The circuit 749 may receive an input from an enable signal 732. The enable signal 732 may initiate the restore operation or the backup operation. The waveform diagram 750 illustrates the restore operation. The enable signal 732 is shown as a global signal but other configurations are contemplated.

The circuit 749 may receive the enable signal 732 at the pulse generator 720 and pulse generator 722. As described in FIG. 7A, a pulse generator may be a configuration of logic elements that produce a pulse of a particular interval. For example, the pulse generator 720 may be configured to produce a pulse of pulse width 728.

The pulse generator 720 may produce a pulse signal 726 of pulse width 728 which may further be received by a NOR gate (described below) and transmitted to the feedback line 118. The pulse generator 722 may produce a pulse signal 730. The pulse generator 722 may couple to a delay circuit 724. The delay circuit 724 may delay the pulse signal 730 from the pulse generator 722 and produce a delayed pulse signal with a pulse width 729 which may also be referred to as the backup signal 128.

Figure 7C:
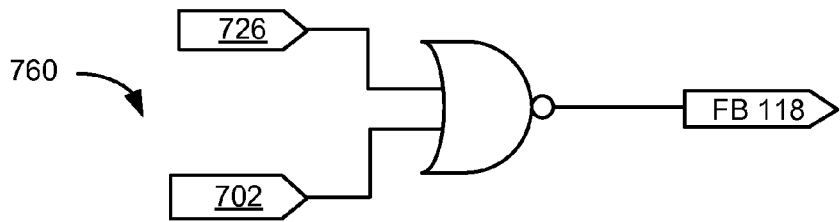
FIG. 7C illustrates a circuit that receives an input signal from a delay circuit and an input signal from a pulse generator, according to various embodiments.

FIG. 7C illustrates a circuit 760 that receives an input signal 702 from the delay circuit 712 and an input signal 726 from the pulse generator 720, according to various embodiments. The circuit 760 may be configured so that when one input signal, either 702 or 726, is turned on, then the output is turned off. In the shown embodiment, the circuit 760 is a NOR gate 760 but other configurations are contemplated. The circuit 760 may couple to the feedback line 118.

Figure 6:
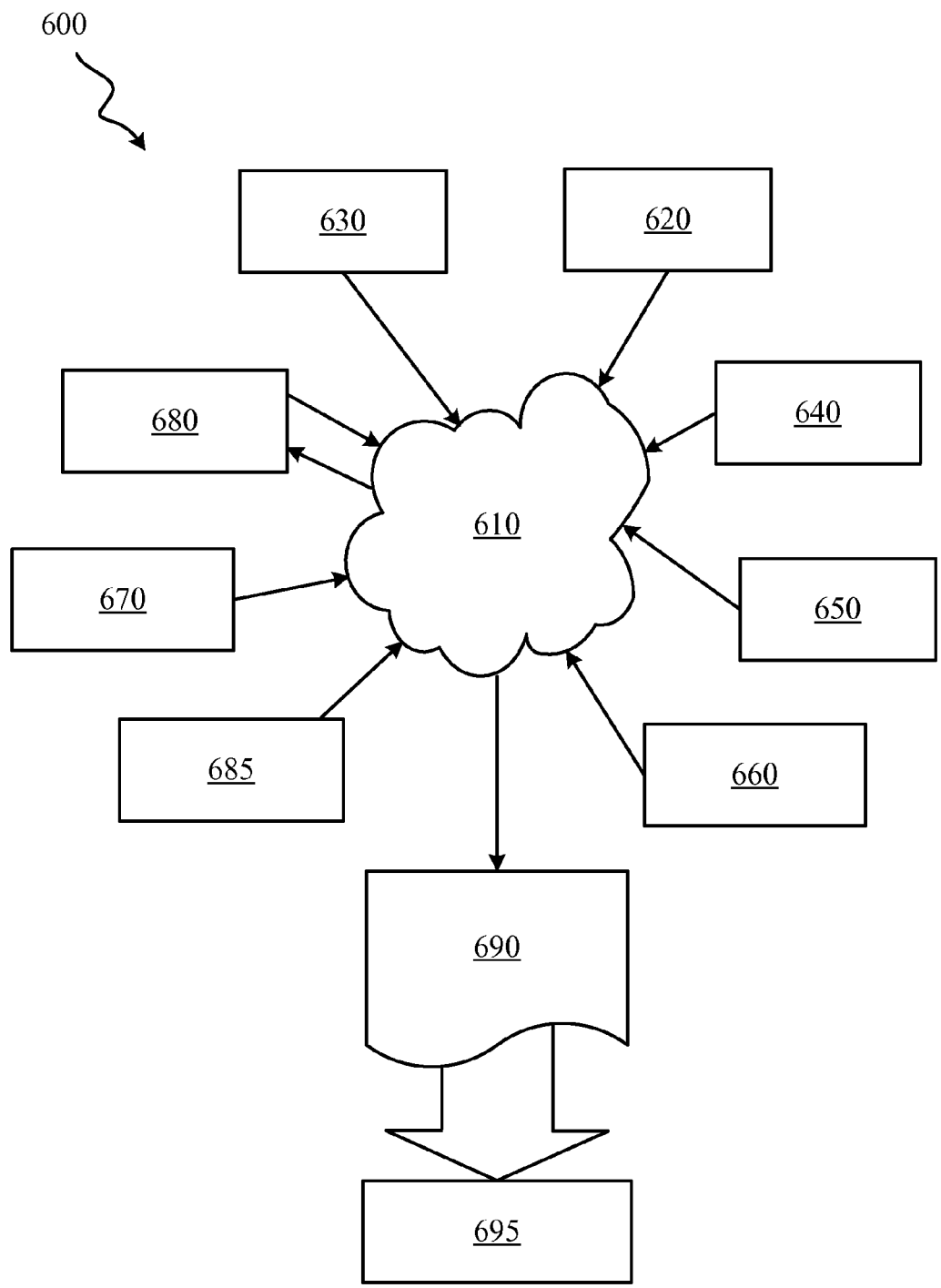
FIG. 6 illustrates multiple design structures including an input design structure that is preferably processed by a design process.

FIG. 6 illustrates multiple design structures 600 including an input design structure 620 that is preferably processed by a design process. Design structure 620 may be a logical simulation design structure generated and processed by design process 610 to produce a logically equivalent functional representation of a hardware device. Design structure 620 may alternatively include data or program instructions that, when processed by design process 610, generate a functional representation of the physical structure of a hardware device. Whether representing functional or structural design features, design structure 620 may be generated using electronic computer-aided design, such as that implemented by a core developer/designer. When encoded on a machine-readable data transmission, gate array, or storage medium, design structure 620 may be accessed and processed by one or more hardware or software modules within design process 610 to simulate or otherwise functionally represent an electronic component, circuit, electronic or logic module, apparatus, device, or system such as those shown in FIGS. 1 and 2. As such, design structure 620 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 610 preferably employs and incorporates hardware or software modules for synthesizing, translating, or otherwise processing a design/simulation functional equivalent of the components, circuits, devices, or logic structures shown in FIGS. 1 and 2 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describe the connections to other elements and circuits in an integrated circuit design. Netlist 680 may be synthesized using an iterative process in which Netlist 680 is resynthesized one or more times depending on design specifications and parameters for the device. As with other design structure types described herein, Netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 650, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610, without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures, along with any additional mechanical design or data, to generate a second design structure 690. Design structure 690 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIG. 1. In one embodiment, design structure 690 may comprise a compiled, executable HDL simulation model that functionally simulates the devices shown in FIGS. 1 and 2.

Design structure 690 may also employ a data format used for the exchange of layout data of integrated circuits and/or symbolic data format (e.g., information stored in a GDSII, GL1, OASIS, map files, or any other suitable format for storing such design data structures). Design structure 690 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 2. Design structure 690 may then proceed to a state 695 where, for example, design structure 690 proceeds to tape-out, is released to manufacturing, is released to a mask house, is sent to another design house, is sent back to the customer, etc.

Although the present invention has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the invention

What is claimed is:

1. A Static Random Access Memory (SRAM) device, comprising:
   one or more SRAM cells, each SRAM cell including:
      a first and a second CMOS inverter that are cross-coupled;
      a feedback switch coupled to an output of the first CMOS inverter and an input of the second CMOS inverter; and
      a capacitive backup circuit, not in a feedback circuit formed by the first and the second CMOS inverter, coupled to the output of the feedback switch, the backup circuit including:
         a capacitor; and
         a backup switch configured in a series connection between the capacitor and the feedback switch and configured to selectively isolate the capacitor from the feedback circuit.

2. The SRAM device of claim 1, further comprising one or more pass switches on the SRAM cell coupled to a word bit line and the input of the second CMOS inverter.

3. The SRAM device of claim 1, further comprising a read circuit on the SRAM cell coupled to the output of the second inverter.

4. The SRAM device of claim 1, wherein a beta ratio for second CMOS inverter is biased.

5. The SRAM device of claim 1, wherein the capacitor is an eDRAM trench capacitor.

6. The SRAM device of claim 5, wherein the capacitor is coupled to a resistor in series.

7. An SRAM device, comprising:
   one or more SRAM cells, each SRAM cell having cross-coupled inverters that are configured and arranged to hold a memory state;
   a capacitive backup circuit having at least one capacitive element, the capacitive backup circuit configured and arranged to:
      store a backup copy of the memory state in response to an activation of a backup switch and a deactivation of an input voltage; and
      provide the backup copy of the memory state in response to the deactivation of a feedback switch, activation of the backup switch, and the deactivation of the input voltage.

8. The SRAM device of claim 5, wherein the capacitive element is an eDRAM trench capacitor.

9. The SRAM device of claim 5, wherein a first inverter from the cross-coupled inverters is stronger than a second inverter from the cross-coupled inverters.

10. The SRAM device of claim 9, wherein the first inverter is stronger than a write bit line driver.

11. The SRAM device of claim 9, wherein a beta ratio of the second inverter is biased.

12. The SRAM device of claim 5, wherein the SRAM cell includes a read circuit.

13. The SRAM device of claim 5, wherein the SRAM cell includes a feedback switch.

* * * * *